(12) United States Patent
Chiu et al.

(10) Patent No.: US 6,333,271 B1
(45) Date of Patent: Dec. 25, 2001

(54) MULTI-STEP PLASMA ETCH METHOD FOR PLASMA ETCH PROCESSING A MICROELECTRONIC LAYER

(75) Inventors: Yuan Hung Chiu, Taipei; Yu-I Wang, Taichung; Hun-Jan Tao; Huan Just Lin, both of Hsinchu, all of (TW)

(73) Assignee: Taiwan Semiconductor Manufacturing Company, Ltd., Hsin Chu (TW)

( * ) Notice: Subject to any disclaimer, the term of this patent is extended or adjusted under 35 U.S.C. 154(b) by 0 days.

(21) Appl. No.: 09/821,559

(22) Filed: Mar. 29, 2001

(51) Int. Cl.[7] .................................................. H01L 21/461
(52) U.S. Cl. ............................................ 438/706; 438/710
(58) Field of Search ..................................... 438/704, 706, 438/709, 710, 711, 712, 719, 734

(56) References Cited

U.S. PATENT DOCUMENTS

| 4,838,992 | * | 6/1989 | Abraham ............................... 156/643 |
| 5,223,914 | | 6/1993 | Auda et al. . |
| 5,236,549 | * | 8/1993 | Shirakawa et al. .................. 156/643 |
| 5,362,356 | | 11/1994 | Schoenborn . |
| 5,419,804 | * | 5/1995 | Ojha et al. ........................... 156/643 |
| 5,871,658 | * | 2/1999 | Tao et al. .............................. 216/60 |
| 5,903,351 | | 5/1999 | Jeong et al. . |
| 5,981,398 | * | 11/1999 | Tsai et al. ............................ 438/710 |
| 6,211,092 | * | 4/2001 | Tang et al. ........................... 438/719 |

* cited by examiner

Primary Examiner—David Nelms
Assistant Examiner—David Vu
(74) Attorney, Agent, or Firm—Tung & Associates

(57) ABSTRACT

A plasma etch method for plasma etch processing a microelectronic layer formed over a substrate, comprises a two step plasma etch method. Within a first step, the microelectronic layer is etched while employing a first plasma etch method employing a first detection apparatus optimized to measure a thickness of the microelectronic layer. The first detection apparatus controls the first plasma etch method to stop prior to reaching the substrate to thus form from the microelectronic layer a partially etched microelectronic layer. Within a second step, the partially etched microelectronic layer is etched while employing a second plasma etch method employing a second detection apparatus optimized to detect the substrate. The second detection apparatus controls the second etch method to stop on the substrate when etching the partially etched microelectronic layer to form a completely etched microelectronic layer. The method is particularly useful for forming gate electrodes for use within field effect transistors for use within semiconductor integrated circuit microelectronic fabrications.

16 Claims, 1 Drawing Sheet

MULTI-STEP PLASMA ETCH METHOD FOR PLASMA ETCH PROCESSING A MICROELECTRONIC LAYER

BACKGROUND OF THE INVENTION

1. Field of the Invention

The present invention relates generally to plasma etch methods for plasma etch processing microelectronic layers employed when fabricating microelectronic fabrications. More particularly, the present invention relates to plasma etch methods for optimally plasma etch processing microelectronic layers employed when fabricating microelectronic fabrications.

2. Description of the Related Art

Microelectronic fabrications are formed from microelectronic substrates over which are formed patterned microelectronic conductor layers which are separated by microelectronic dielectric layers.

In order to form patterned microelectronic conductor layers employed for fabricating microelectronic fabrications, as well as other patterned microelectronic layers employed for fabricating microelectronic fabrications, there is often employed plasma etch methods, such as but not limited to reactive ion etch (RIE) plasma etch methods, which are employed in conjunction with patterned mask layers for forming from blanket microelectronic layers within microelectronic fabrications patterned microelectronic layers within microelectronic fabrications.

While plasma etch methods are thus quite common in the art of microelectronic fabrication for forming from blanket microelectronic layers for use when fabricating microelectronic fabrications patterned microelectronic layers for use when fabricating microelectronic fabrications, plasma etch methods are nonetheless not entirely without problems in the art of microelectronic fabrication for forming, more generally, from microelectronic layers for use when fabricating microelectronic fabrications plasma etch processed microelectronic layers for use when fabricating microelectronic fabrications. In that regard, it is often difficult within the art of microelectronic fabrication to optimally plasma etch process a microelectronic layer when forming therefrom a plasma etch processed microelectronic layer while simultaneously providing for accurate endpoint detection when plasma etch processing the microelectronic layer when forming therefrom the plasma etch processed microelectronic layer.

It is thus desirable in the art of microelectronic fabrication to provide plasma etch methods through which microelectronic layers may be optimally plasma etch processed to form therefrom plasma etch processed microelectronic layers while simultaneously providing accurate endpoint detection when plasma etch processing the microelectronic layers to form therefrom the plasma etch processed microelectronic layers.

It is towards the foregoing object that the present invention is directed.

Various plasma etch methods, plasma etch apparatus and plasma etch systems have been disclosed in the art of microelectronic fabrication for monitoring and controlling plasma etch processes for use when plasma etch processing microelectronic layers to form plasma etch processed microelectronic layers for use when fabricating microelectronic fabrications.

Including among the plasma etch methods, plasma etch apparatus and plasma etch systems, but not limited among the plasma etch methods, plasma etch apparatus and plasma etch systems, are plasma etch methods, plasma etch apparatus and plasma etch systems disclosed within: (1) Auda et al., in U.S. Pat. No. 5,223,914 (a plasma etch method and a plasma etch apparatus which employ a plasma emission spectrometer as an interferometer for purposes of providing an accurate thickness measurement and a correlating accurate linewidth measurement when plasma etch processing a patterned microelectronic layer within a microelectronic fabrication to form an isotropically plasma etch processed microelectronic layer within the microelectronic fabrication); (2) Schoenborn, in U.S. Pat. No. 5,362,356 (a related plasma etch method which also employs a plasma emission spectrometer as an interferometer for purposes of accurately determining a microelectronic layer thickness when plasma etch processing the microelectronic layer while employing the plasma etch method); and (3) Jeong et al., in U.S. Pat. No. 5,903,351 (a plasma etch method and a plasma etch apparatus which alternatively provides for both a plasma emission spectrometer analysis and substrate surface spectrometer analysis when plasma etch processing a microelectronic fabrication to form a plasma etch processed microelectronic fabrication).

Desirable in the art of microelectronic fabrication are additional plasma etch methods through which microelectronic layers may be optimally plasma etch processed to form therefrom plasma etch processed microelectronic layers while simultaneously providing accurate endpoint detection when plasma etch processing the microelectronic layers to form therefrom the plasma etch processed microelectronic layers.

It is towards the foregoing object that the present invention is directed.

SUMMARY OF THE INVENTION

A first object of the present invention is to provide a plasma etch method for forming from a microelectronic layer within a microelectronic fabrication a plasma etch processed microelectronic layer within the microelectronic fabrication.

A second object of the present invention is to provide a plasma etch method in accord with the first object of the present invention, wherein an endpoint is accurately determined when forming within the microelectronic fabrication from the microelectronic layer the plasma etch processed microelectronic layer.

A third object of the present invention is to provide a method in accord with the first object of the present invention and the second object of the present invention, wherein the method is readily commercially implemented.

In accord with the objects of the present invention, there is provided by the present invention a plasma etch method for plasma etch processing a microelectronic layer. To practice the method of the present invention, there is first provided a substrate having formed thereupon a microelectronic layer. There is then etched the microelectronic layer while employing a first plasma etch method employing a first detection apparatus optimized to measure a thickness of the microelectronic layer. Within the present invention, the first detection apparatus controls the first plasma etch method to stop prior to reaching the substrate to thus form from the microelectronic layer a partially etched microelectronic layer. There is then etched the partially etched microelectronic layer while employing a second plasma etch method employing a second detection apparatus optimized to detect the substrate. Within the present invention, the second detection apparatus controls the second etch method to stop on the substrate when etching the partially etched microelectronic layer to form a completely etched microelectronic layer.

The present invention provides a plasma etch method for forming from a microelectronic layer within a microelectronic fabrication a plasma etch processed microelectronic layer within the microelectronic fabrication, wherein an endpoint is accurately determined when forming within the microelectronic fabrication from the microelectronic layer the plasma etch processed microelectronic layer.

The present invention realizes the foregoing object by employing a two step plasma etch method for plasma etch processing a microelectronic layer formed upon a substrate employed within a microelectronic fabrication, wherein: (1) a first plasma etch method employed within the two step plasma etch method employs a first detection apparatus optimized to measure a thickness of the microelectronic layer, and where the first detection apparatus controls the first plasma etch method to stop prior to reaching the substrate to thus form from the microelectronic layer a partially etched microelectronic layer; and (2) a second plasma etch method employed within the two step plasma etch method employs a second detection apparatus optimized to detect the substrate, and where the second detection apparatus controls the second plasma etch method to stop on the substrate when etching the partially etched microelectronic layer to form a completely etched microelectronic layer.

The method of the present invention is readily commercially implemented.

The present invention employs methods, apparatus and systems as are generally known in the art of microelectronic fabrication, but employed within the context of a specific set of process limitations to provide the present invention. Since it is thus a specific set of process limitations which provides at least in part the present invention, rather than the existence of methods, apparatus and systems which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

Figure 1:
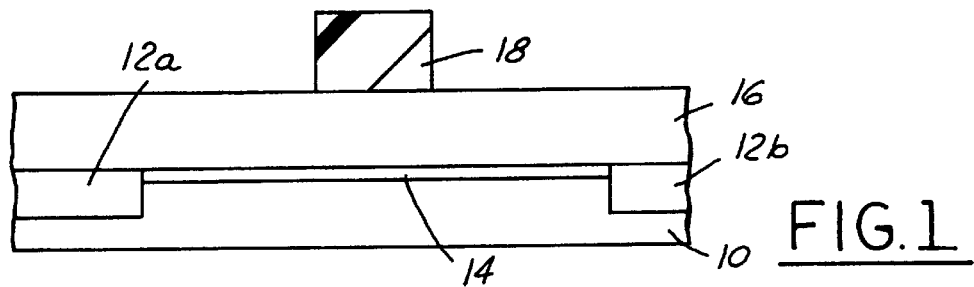
FIG. 1, FIG. 2, FIG. 3 and FIG 4 show a series of schematic cross-sectional diagrams illustrating the results of progressive stages of forming, in accord with a preferred embodiment of the present invention, a gate electrode for use within a field effect transistor (FET) for use within a semiconductor integrated circuit microelectronic fabrication.

The present invention provides a plasma etch method for forming from a microelectronic layer within a microelectronic fabrication a plasma etch processed microelectronic layer within the microelectronic fabrication, wherein an endpoint is accurately determined when forming within the microelectronic fabrication from the microelectronic layer the plasma etch processed microelectronic layer.

The present invention realizes the foregoing object by employing a two step plasma etch method for plasma etch processing a microelectronic layer formed upon a substrate, wherein: (1) a first plasma etch method employed within the two step plasma etch method employs a first detection apparatus optimized to measure a thickness of the microelectronic layer, and where the first detection apparatus controls the first plasma etch method to stop prior to reaching the substrate to thus form from the microelectronic layer a partially etched microelectronic layer; and (2) a second plasma etch method employed within the two step plasma etch method employs a second detection apparatus optimized to detect the substrate, and where the second detection apparatus controls the second plasma etch method to stop on the substrate when etching the partially etched microelectronic layer to form a completely etched microelectronic layer.

Although the preferred embodiment of the present invention illustrates the present invention most particularly within the context of forming, with enhanced linewidth control and with enhanced endpoint control, a gate electrode for use within a field effect transistor (FET) for use within a semiconductor integrated circuit microelectronic fabrication, to thus provide inhibited overetching into a gate dielectric layer upon which is formed the gate electrode for use within the field effect transistor (FET) for use within the semiconductor integrated circuit microelectronic fabrication, the present invention may in general be employed for plasma etch processing, with enhanced endpoint control, masked or unmasked microelectronic layers formed of microelectronic materials including but not limited to microelectronic conductor materials, microelectronic semiconductor materials and microelectronic dielectric materials, to thus provide inhibited overetching into microelectronic substrate layers upon which they are formed, where the microelectronic substrate layers may similarly also be formed of microelectronic materials including but not limited to microelectronic conductor materials, microelectronic semiconductor materials and microelectronic dielectric materials. Typically and preferably, within the context of the present invention, a microelectronic layer which is plasma etched while employing the method of the present invention is initially formed to a thickness of from about 1000 to about 3500 angstroms, and in accord with the description which follows partially etched, while employing a first plasma etch method, to a thickness above the gate dielectric layer of from about 100 to about 800 angstroms.

Similarly, the present invention may be employed for plasma etch processing microelectronic layers employed when fabricating microelectronic fabrications selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Referring now to FIG. 1 to FIG. 4, there is shown a series of schematic cross-sectional diagrams illustrating the results of progressive stages of forming, in accord with a preferred embodiment of the present invention, a gate electrode for use within a field effect transistor (FET) for use within a semiconductor integrated circuit microelectronic fabrication.

Shown in FIG. 1 is a schematic cross-sectional diagram of the semiconductor integrated circuit microelectronic fabrication at an early stage in its fabrication in accord with the preferred embodiment of the present invention.

Shown in FIG. 1, in a first instance, is a semiconductor substrate 10 having formed therein a pair of isolation regions 12a and 12b which define an active region of the semiconductor substrate 10.

Within the preferred embodiment of the present invention with respect to the semiconductor substrate 10, and although it is known in the art of semiconductor integrated circuit microelectronic fabrication that semiconductor substrates are available with either dopant polarity, several dopant concentrations and various crystallographic orientations, for the preferred embodiment of the present invention the semiconductor substrate 10 is typically and preferably a (100) silicon semiconductor substrate having an N- or P-doping concentration.

Similarly, within the preferred embodiment of the present invention with respect to the pair of isolation regions 12a and 12b which define the active region of the semiconductor substrate 10, although it is known in the art of semiconductor integrated circuit microelectronic fabrication that isolation regions may be formed employing methods including but not limited to isolation region thermal growth methods and isolation region deposition/patterning methods, for the preferred embodiment of the present invention, and as specifically illustrated within the schematic cross-sectional diagram of FIG. 1, the pair of isolation regions 12a and 12b is typically and preferably formed as a pair of shallow trench isolation (STI) regions, employing at least in part an isolation region deposition/patterning method.

Shown also within the schematic cross-sectional diagram of FIG. 1, and formed upon the active region of the semiconductor substrate 10 and bounded by the pair of isolation regions 12a and 12b is a gate dielectric layer 14. Similarly, there is also shown within the schematic cross-sectional diagram of FIG. 1 formed upon the pair of isolation regions 12a and 12b and the gate dielectric layer 14 a blanket gate electrode material layer 16.

Within the preferred embodiment of the present invention with respect to the gate dielectric layer 14, and although it is known in the art of semiconductor integrated circuit microelectronic fabrication that gate dielectric layers may be formed employing methods including but not limited to gate dielectric layer thermal growth methods and gate dielectric layer deposition/patterning methods, for the preferred embodiment of the present invention, the gate dielectric layer 14 is typically and preferably formed employing a gate dielectric layer thermal growth method to provide the gate dielectric layer of silicon oxide of thickness from about 10 to about 32 angstroms formed upon the active region of the semiconductor substrate and bounded by the pair of isolation regions 12a and 12b.

Similarly, within the preferred embodiment of the present invention with respect to the blanket gate electrode material layer 16, and although it is known in the art of semiconductor integrated circuit microelectronic fabrication that gate electrode material layers may be formed of gate electrode materials including but not limited to metal, metal alloy, doped polysilicon and polycide (doped polysilicon/metal silicide stack) gate electrode materials, for the preferred embodiment of the present invention, the blanket gate electrode material layer 16 is typically and preferably formed at least in part of a doped polysilicon gate electrode material, formed to a thickness of from about 1000 to about 3500 angstroms upon the pair of isolation regions 12a and 12b and the gate dielectric layer 14.

Finally, there is also shown within the schematic cross-sectional diagram of FIG. 1, and formed upon the blanket gate electrode material layer 16, and nominally centered above the active region of the semiconductor substrate 10, a patterned photoresist layer 18.

Within the preferred embodiment of the present invention with respect to the patterned photoresist layer 18, the patterned photoresist layer 18 may be formed of photoresist materials as are conventional in the art of microelectronic fabrication, including but not limited to photoresist materials selected from the general groups of photoresist materials including but not limited to positive photoresist materials and negative photoresist materials. Typically and preferably, the patterned photoresist layer 18 is formed to a thickness of from about 2000 to about 5000 angstroms and a linewidth of from about 0.7 to about 0.35 microns, upon the blanket gate electrode material layer 16.

Although not specifically illustrated within the schematic cross-sectional diagram of FIG. 1, and as is understood by a person skilled in the art, there may also be employed within the present invention, and formed interposed between the blanket gate electrode material layer 16 and the patterned photoresist layer 18 a patterned hard mask layer, as well as an antireflective coating (ARC) layer.

Figure 2:
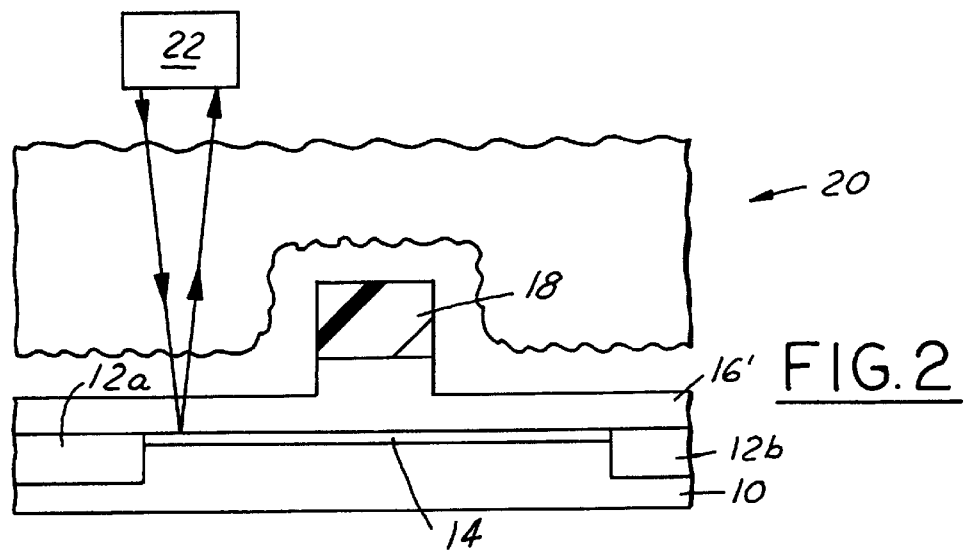

Referring now to FIG. 2, there is shown a schematic cross-sectional diagram illustrating the results of further processing of the semiconductor integrated circuit microelectronic fabrication whose schematic cross-sectional diagram is illustrated in FIG. 1.

Shown in FIG. 2 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 1, but wherein, in a first instance, the blanket gate electrode material layer 16 as illustrated within the schematic cross-sectional diagram of FIG. 1 has been partially etched to form a partially etched blanket gate electrode material layer 16', while employing the patterned photoresist layer 18 as an etch mask layer, in conjunction with a first etching plasma 20. In a second instance, there is also shown within the schematic cross-sectional diagram of FIG. 2, in conjunction with the first etching plasma 20, a first detection apparatus 22 which measures the thickness of the blanket gate electrode material layer 16 as illustrated within the schematic cross-sectional diagram of FIG. 1 as it is etched within the first etching plasma 20 to form the partially etched blanket gate electrode material layer 16' as illustrated within the schematic cross-sectional diagram of FIG. 2.

Similarly, within the preferred embodiment of the present invention while the blanket gate electrode material layer 16 as illustrated within the schematic cross-sectional diagram of FIG. 1 is partially etched while employing a first plasma etch method employing the first etching plasma 20 and the first detection apparatus 22 optimized to measure a thickness of the blanket gate electrode material layer 16, the first detection apparatus 22 controls the first plasma etch method to stop prior to reaching the gate dielectric layer 14 to thus provide from the blanket gate electrode materials layer 16 as illustrated within the schematic cross-sectional diagram of FIG. 1 the partially etched blanket gate electrode material layer 16' as illustrated within the schematic cross-sectional diagram of FIG. 2.

Within the present invention and the preferred embodiment of the present invention with respect to the first detection apparatus 22, the first detection apparatus may comprise an interferometric detection apparatus (i.e., an optical interferometer) or a spectroscopic detection apparatus (i.e., an optical emission spectrometer) operating as an interferometric detection apparatus, as is further disclosed within the prior art references cited within the Description of the Related Art, all of which related art is incorporated herein fully by reference. Under either circumstance of an interferometric detection apparatus or a spectroscopic detection apparatus operating as an interferometric detection apparatus, there is selected an optical detection wavelength optimized for thickness determination of the blanket gate electrode material layer 16 when forming therefrom the partially etched blanket gate electrode material layer 16' as illustrated within the schematic cross-sectional diagram of FIG. 2.

Within the preferred embodiment of the present invention, and under circumstances where the blanket gate electrode material layer 16 is formed at least in part of a polysilicon gate electrode material, the first etching plasma 20 as employed within the first plasma etch method will typically and preferably employs a chlorine containing etchant gas composition, along with a generally reduced reactor chamber pressure and a generally enhanced bias sputtering power, such as to efficiently etch the blanket gate electrode material layer 16 when forming therefrom the partially etched blanket gate electrode material layer 16', while simultaneously providing an optimal linewidth control of a gate electrode ultimately formed from the partially etched blanket gate electrode material layer 16'.

Thus, when etching the blanket gate electrode material layer 16 as illustrated within the schematic cross-sectional diagram of FIG. 1 to form the partially etched blanket gate electrode material layer 16' as illustrated within the schematic cross-sectional diagram of FIG. 2 when formed upon an eight inch diameter and twelve inch diameter semiconductor substrate 10, the first plasma etch method typically and preferably employs: (1) a reactor chamber pressure of from about 5 to about 60 mtorr; (2) a source radio frequency power of from about 200 to about 500 watts per square centimeter of semiconductor substrate 10 area; (3) a bias sputtering power of from about 50 to about 250 watts per square centimeter of semiconductor substrate 10 area; (4) a semiconductor substrate 10 (and blanket gate electrode material layer 16) temperature of from about 10 to about 80 degrees centigrade; and (5) a chlorine etchant gas flow rate of from about 150 to about 350 standard cubic centimeters per minute (sccm).

Within the preferred embodiment of the present invention, the blanket gate electrode material layer 16 as illustrated within the schematic cross-sectional diagram of FIG. 1 is etched within the first plasma etch method employing the first etching plasma 20 which is controlled by the first detection apparatus 22 to leave remaining a thickness of the partially etched blanket gate electrode material layer 16' of from about 100 to about 800 angstroms above the gate dielectric layer 14' or ST1 layer 12a. Such control may be readily effected through analysis of a sinusoidal optical interferometric detection curve.

Figure 3:
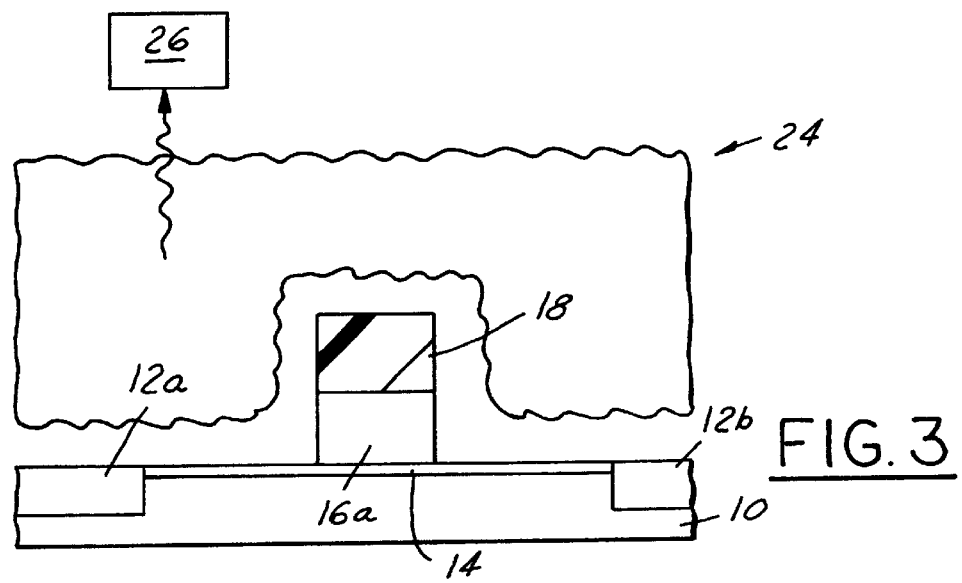

Referring now to FIG. 3, there is shown a schematic cross-sectional diagram illustrating the results of further processing of the semiconductor integrated circuit microelectronic fabrication whose schematic cross-sectional diagram is illustrated in FIG. 2.

Shown in FIG. 3 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 2, but wherein the partially etched blanket gate electrode material layer 16' as illustrated in the schematic cross-sectional diagram of FIG. 2 has been completely etched to form a gate electrode 16a, while still employing the patterned photoresist layer 18 as an etch mask, but while now employing a second etching plasma 24 in conjunction with a second detection apparatus 26.

Within the preferred embodiment of the present invention, the partially etched gate electrode material layer 16' as illustrated within the schematic cross-sectional diagram of FIG. 2 is etched to form the gate electrode 16a as illustrated within the schematic cross-sectional diagram of FIG. 3, while employing a second plasma etch method employing the second etching plasma 24 and the second detection apparatus 26 optimized to detect the gate dielectric layer 14. Similarly, within the preferred embodiment of the present invention the second detection apparatus 26 controls the second plasma etch method to stop on the gate dielectric layer 14 when etching the partially etched blanket gate electrode material layer 16 to form therefrom the gate electrode 16a, although under certain circumstances a specific amount of overetch while employing the second plasma etch method, or an additional third plasma etch method, may also be provided to fully clear any gate electrode material from the gate dielectric layer 14.

In order to effect the foregoing result, and similarly under circumstances where the partially etched blanket gate electrode material layer 16' is formed at least in part of a polysilicon gate electrode material and the gate dielectric layer 14 is formed of a silicon oxide gate dielectric material, the second etching plasma 24 is neither identical with or equivalent with the first etching plasma 20, but still employs a chlorine containing etchant gas composition, but nonetheless with a generally higher reactor chamber pressure, a generally lower bias power and an added oxygen containing oxidant material, such as to effect the selectivity of the second etching plasma 24 for the partially etched blanket gate electrode material layer 16' with respect to the gate dielectric layer 14.

Typically and preferably, the second etching plasma also employs for etching the partially etched blanket gate electrode material layer 16' as illustrated within the schematic cross-sectional diagram of FIG. 2 to form therefrom the gate electrode 16a as illustrated within the schematic cross-sectional diagram of FIG. 3 upon an eight inch diameter or 12 inch diameter semiconductor substrate 10: (1) a reactor chamber pressure of from about 20 to about 80 mtorr; (2) a source radio frequency power of from about 200 to about 500 watts per square centimeter of semiconductor substrate 10 surface area; (3) a bias power of from about 25 to about 200 watts per square centimeter of semiconductor substrate 10 surface area; (4) a semiconductor substrate 10 (and partially etched blanket gate electrode material layer 16') temperature of from about 10 to about 80 degrees centigrade; (5) a chlorine etchant gas flow rate of from about 150 to about 350 standard cubic centimeters per minute (sccm); and (6) an oxygen oxidant flow rate of from about 2 about 10 standard cubic centimeters per minute (sccm), and more important, the bias voltage of the second etching plasma should be less than (or equal to) the bias voltage of the first etching plasma.

Within the preferred embodiment of the present invention with respect to the second detection apparatus 26 which is optimized to detect as a substrate the gate dielectric layer 14 when etching the partially etched blanket gate electrode material layer 16 as illustrated within the schematic cross-sectional diagram of FIG. 2 to form therefrom the gate electrode 16a as illustrated within the schematic cross-sectional diagram of FIG. 3, the second detection apparatus is typically and preferably a plasma emission spectrometer apparatus.

In order to realize the foregoing result however, the second detection apparatus 26 as a plasma emission spectrometer apparatus, will be tuned to a plasma emission wavelength which is particularly sensitive to reaching the gate dielectric layer 14.

As is further understood by a person skilled in the art, and within the context of the first detection apparatus 22 as illustrated within the schematic cross-sectional diagram of FIG. 2, it is plausible within the context of the present invention to employ a single plasma emission spectrometer apparatus for both the first detection apparatus 22 and the second detection apparatus 26, but in so doing it is preferred to employ a first plasma emission wavelength for the first plasma etch method and a separate second plasma emission wavelength for the second plasma etch method. The first plasma emission wavelength and the second plasma emission wavelength are selected and tuned for their separate detection characteristics as noted above, and such as to provide a very clear endpoint with respect to the second plasma etch method so that overetching may be avoided.

Figure 4:
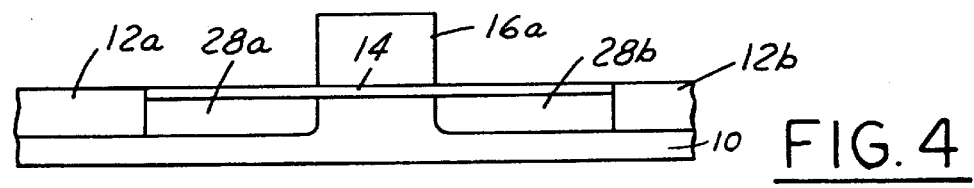

Referring now to FIG. 4, there is shown a schematic cross-sectional diagram illustrating the results of further processing of the semiconductor integrated circuit microelectronic fabrication whose schematic cross-sectional diagram is illustrated in FIG. 3.

Shown in FIG. 4 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 3, but wherein, in a first instance, the patterned photoresist layer 18 has been stripped from the gate electrode 16a.

Within the preferred embodiment of the present invention, the patterned photoresist layer 18 may be stripped from the gate electrode 16a as illustrated within the schematic cross-sectional diagram of FIG. 3 to provide in part the semiconductor integrated circuit microelectronic fabrication whose schematic cross-sectional diagram is illustrated in FIG. 4 while employing photoresist stripping methods and materials as are conventional in the art of microelectronic fabrication, including but not limited to wet chemical photoresist stripping methods and materials and dry plasma photoresist stripping methods and materials.

Shown also within the schematic cross-sectional diagram of FIG. 4, and formed into a pair of active regions of the semiconductor substrate 10 while employing the gate electrode 16a as a mask, is a pair of source/drain regions 28a and 28b.

Within the preferred embodiment of the present invention, the pair of source/drain regions 28a and 28b may be formed employing methods and materials as are conventional in the art of semiconductor integrated circuit microelectronic fabrication, which will typically and preferably employ ion implant methods.

Upon forming the gate electrode 16a within the field effect transistor (FET) within the semiconductor integrated circuit microelectronic fabrication whose schematic cross-sectional diagram is illustrated in FIG. 4, there is formed the field effect transistor (FET) with enhanced performance insofar as there is employed when forming the gate electrode a two step plasma etch method wherein: (1) a first step within the two step plasma etch method employs a first plasma etch method generally directed towards preserving a linewidth of the gate electrode while being monitored and controlled by a first detection apparatus which is optimized primarily to measure a thickness of a blanket gate electrode material layer from which is ultimately formed the gate electrode; and (2) a second step within the two step plasma etch method employs a second plasma etch method optimized for sensitivity of etching the blanket gate electrode material layer with respect to a gate dielectric layer, while being monitored and controlled by a second detection apparatus which is optimized to detect and stop upon the gate dielectric layer when etching the blanket gate electrode material layer.

As is understood by a person skilled in the art, the preferred embodiment of the present invention is illustrative of the present invention rather than limiting of the present invention. Revisions and modifications may be made to methods, materials, structures and dimensions employed within the context of the preferred embodiment of the present invention while still providing a plasma etch method in accord with the present invention, further in accord with the accompanying claims.

What is claimed is:

1. A plasma etch method for plasma etch processing a microelectronic layer comprising:

providing a substrate having formed thereupon a microelectronic layer;

etching the microelectronic layer while employing a first plasma etch method employing a first detection apparatus optimized to measure a thickness of the microelectronic layer, the first detection apparatus controlling the first plasma etch method to stop prior to reaching the substrate to thus form from the microelectronic layer a partially etched microelectronic layer; and etching the partially etched microelectronic layer while employing a second plasma etch method employing a second detection apparatus optimized to detect the substrate, the second detection apparatus controlling the second etch method to stop on the substrate and followed by over etch step to clearly remove microelectronic dielectric layer residue to form a completely etched microelectronic layer.

2. The method of claim 1 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

3. The method of claim 1 wherein the substrate is formed from a microelectronic material selected from the group consisting of microelectronic conductor materials, microelectronic semiconductor materials and microelectronic dielectric materials.

4. The method of claim 1 wherein the microelectronic layer is formed from a microelectronic materials selected from the group consisting of microelectronic conductor materials, microelectronic semiconductor materials and microelectronic dielectric materials.

5. The method of claim 1 wherein the microelectronic layer is formed to a thickness of from about 1000 to about 2500 angstroms.

6. The method of claim 5 wherein the microelectronic layer is etched while employing the first plasma etch method to form the partially etched microelectronic layer of thickness above the dielectric layer about 100 angstrom to 800 angstrom.

7. The method of claim 1 wherein the microelectronic layer is partially masked when plasma etched while employing the first plasma etch method and the second plasma etch method.

8. The method of claim 1 wherein the microelectronic layer is not partially masked when plasma etched while employing the first plasma etch method and the second plasma etch method.

9. The method of claim 1 wherein:

the first detection apparatus is selected from the group consisting of interferometric detection apparatus and plasma emission spectroscopic apparatus operated as interferometric detection apparatus; and the second detection apparatus is a plasma emission spectroscopic apparatus.

10. The method of claim 1 wherein:

the first detection apparatus is a plasma emission spectroscopic apparatus operating at a first wavelength; and the second detection apparatus is the plasma emission spectroscopic apparatus operating at a second wavelength, where the first wavelength is not equal to the second wavelength.

11. A plasma etch method for forming a gate electrode comprising:

providing a semiconductor substrate having formed thereupon a gate dielectric layer in turn having formed thereupon a blanket gate electrode material layer in turn having formed thereupon a patterned photoresist layer;

etching exposed portions of the blanket gate electrode material layer while employing a first plasma etch method employing a first detection apparatus optimized to measure a thickness of the blanket gate electrode material layer, the first detection apparatus controlling the first plasma etch method to stop prior to reaching the gate dielectric layer to thus form from the blanket gate electrode material layer a partially etched blanket gate electrode material layer; and etching the partially etched blanket gate electrode material layer while employing a second plasma etch method employing a second detection apparatus optimized to detect the gate dielectric layer, the second detection apparatus controlling the second etch method to stop on the gate dielectric layer when etching the partially etched blanket gate electrode material layer to form a gate electrode.

12. The method of claim 11 wherein the blanket gate electrode material layer is formed from a gate electrode material selected from the group consisting of metals, metal alloys, doped polysilicon and polycides.

13. The method of claim 11 wherein the blanket gate electrode material layer is formed to a thickness of from about 1000 to about 3500 angstroms.

14. The method of claim 13 wherein the blanket gate electrode material layer is etched while employing the first plasma etch method to form the partially etched blanket gate electrode material layer of thickness from about 100 to about 800 angstroms above the gate dielectric layer.

15. The method of claim 11 wherein:

the first detection apparatus is selected from the group consisting of interferometric detection apparatus and plasma emission spectroscopic apparatus operated as interferometric detection apparatus; and the second detection apparatus is a plasma emission spectroscopic apparatus.

16. The method of claim 11 wherein:

the first detection apparatus is a plasma emission spectroscopic apparatus operating at a first wavelength; and the second detection apparatus is the plasma emission spectroscopic apparatus operating at a second wavelength, where the first wavelength is not equal to the second wavelength.

* * * * *